(12) United States Patent
Phillips et al.

(10) Patent No.: US 7,867,688 B2
(45) Date of Patent: Jan. 11, 2011

(54) LASER ABLATION RESIST

(75) Inventors: Scott E. Phillips, Rochester, NY (US); Timothy J. Tredwell, Fairport, NY (US); Lee W. Tutt, Webster, NY (US); Glenn T. Pearce, Webster, NY (US); Kelvin Nguyen, Corning, NY (US); Ronald M. Wexler, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 149 days.

(21) Appl. No.: 11/420,817

(22) Filed: May 30, 2006

(65) Prior Publication Data

US 2007/0281247 A1 Dec. 6, 2007

(51) Int. Cl.
G03F 7/00 (2006.01)
G03F 7/004 (2006.01)
G03F 7/20 (2006.01)
G03F 7/36 (2006.01)

(52) U.S. Cl. .............. 430/270.1; 430/322; 430/323; 430/325; 430/330; 430/331; 430/944; 430/945; 430/396; 430/302

(58) Field of Classification Search .................. 430/73, 430/200, 252, 201, 302, 330, 322, 270.1, 430/325; 257/773; 149/19.1; 522/94
See application file for complete search history.

(56) References Cited

U.S. PATENT DOCUMENTS

| | | | | |
|---|---|---|---|---|
| 4,675,273 A | 6/1987 | Woods et al. | ........... | 430/325 |
| 4,686,168 A | 8/1987 | Fujii et al. | ........... | 430/326 |
| 4,710,445 A * | 12/1987 | Sanders | ........... | 430/252 |
| 4,973,572 A | 11/1990 | DeBoer | ........... | 503/227 |
| 5,145,760 A * | 9/1992 | Blanchet-Fincher et al. | .. | 430/73 |
| 5,359,101 A | 10/1994 | Woods et al. | ........... | 556/52 |
| 5,468,591 A | 11/1995 | Pearce et al. | ........... | 430/201 |
| 5,500,059 A * | 3/1996 | Lund et al. | ........... | 149/19.1 |
| 5,578,416 A | 11/1996 | Tutt | ........... | 430/270.18 |
| 5,691,114 A * | 11/1997 | Burberry et al. | ........... | 430/302 |
| 5,738,799 A * | 4/1998 | Hawkins et al. | ........... | 216/27 |
| 5,759,741 A * | 6/1998 | Pearce et al. | ........... | 430/271.1 |
| 5,858,607 A * | 1/1999 | Burberry et al. | ........... | 430/201 |
| 5,891,602 A | 4/1999 | Neuman | ........... | 430/200 |
| 6,140,025 A * | 10/2000 | Imai et al. | ........... | 430/325 |
| 6,165,671 A | 12/2000 | Weidner et al. | ........... | 430/201 |
| 6,596,644 B1 * | 7/2003 | Andrews et al. | ........... | 438/710 |

(Continued)

FOREIGN PATENT DOCUMENTS

EP 0 343 603 5/1989

(Continued)

OTHER PUBLICATIONS

Helbert et al.; Radiation Degradation of a-Substituted Acrylate Polymers and Copolymers; Journal of Applied Polymer Science, vol. 21, 1977, pp. 797-807.

(Continued)

*Primary Examiner*—Amanda C. Walke
(74) *Attorney, Agent, or Firm*—Nelson A. Blish; J. Lanny Tucker (57) ABSTRACT

A method of making micro-structure devices by coating a first layer of resist (12) on a substrate (10). A pattern is created on the substrate by radiation induced thermal removal of the resist.

45 Claims, 4 Drawing Sheets

U.S. PATENT DOCUMENTS

| | | | |
|---|---|---|---|
| 6,695,029 B2 | 2/2004 | Phillips et al. | 156/540 |
| 6,787,283 B1 | 9/2004 | Aoai et al. | 430/270.1 |
| 7,198,879 B1* | 4/2007 | Tredwell et al. | 430/200 |
| 2003/0107111 A1* | 6/2003 | Gluschenkov et al. | 257/649 |
| 2003/0140490 A1* | 7/2003 | Olson et al. | 29/846 |
| 2003/0211419 A1 | 11/2003 | Fan | |
| 2003/0211649 A1* | 11/2003 | Hirai et al. | 438/48 |
| 2004/0256731 A1* | 12/2004 | Mao et al. | 257/773 |
| 2004/0265492 A1* | 12/2004 | Free et al. | 427/256 |
| 2005/0074705 A1* | 4/2005 | Toyoda | 430/323 |
| 2005/0266172 A1 | 12/2005 | Kay et al. | 427/561 |
| 2006/0068335 A1* | 3/2006 | Coley et al. | 430/330 |
| 2007/0020530 A1 | 1/2007 | Zientek et al. | |
| 2007/0231541 A1 | 10/2007 | Humpal et al. | |

FOREIGN PATENT DOCUMENTS

| | | |
|---|---|---|
| EP | 0 575 848 | 12/1993 |
| JP | 07056341 A * | 3/1995 |
| JP | 7-56341 | 7/1995 |
| JP | 08073569 A * | 3/1996 |
| WO | 2004/039530 | 5/2004 |
| WO | 2005/121893 | 12/2005 |

OTHER PUBLICATIONS

Hogan et al.; Laser Photoablation of Spin-on-Glass and Poly(Ethyl Cyanoacrylate) Photoresist; Applied Surface Science 36 (1989), pp. 343-349.

Woods et al.; Vapour deposition of poly(alkyl-2-cyanacrylate) resist coatings: a new electron-beam/deep-ultra-violet photoresist technology, Polymer 1989, vol. 30, pp. 1091-1098.

* cited by examiner

LASER ABLATION RESIST

CROSS REFERENCE TO RELATED APPLICATIONS

Reference is made to commonly-assigned copending U.S. patent application Ser. No. 11/240,964, filed Sep. 30, 2005, entitled LASER RESIST TRANSFER MICROFABRICATION OF ELECTRONIC DEVICES; by Tredwell et al., the disclosure of which is incorporated herein.

FIELD OF THE INVENTION

The present invention relates, in general, to fabrication of microelectronic devices and in particular to fabrication of microelectronic devices using a dry process with a resist formed by laser ablation.

BACKGROUND OF THE INVENTION

Lithographic patterning techniques have been employed in conventional fabrication of microelectronic devices, including thin film transistors (TFT) arrays for flat panel application. Conventional photoresist lithographic techniques applied to microfabrication have proved capable of defining structures and forming regions of material on a substrate to within dimensions of about 100 nm.

Based on a printing model, the lithographic process forms a pattern of areas that are either receptive or repellent (non-receptive) to a coating (such as ink) or to some other treatment. Conventional photolithography requires a small number of basic steps, with variations according to the materials used and other factors. A typical sequence is as follows:
  (i) wet coating of a positive-working or negative-working photoresist (such as by spin-coating);
  (ii) prebake of the photoresist;
  (iii) exposure by some form of electromagnetic radiation through an overlay mask using an optical mask aligner to form the pattern;
  (iv) curing of the masked pattern, such as by postbake; and
  (v) removal of the uncured portion, using a liquid etchant.

Following subsequent coating or treatment of the surface, the protective photoresist pattern can then itself be removed.

Steps (i)-(v) may be performed in air, such as in a clean room environment, and are typically performed using separate pieces of equipment. Alternately, one or more steps, such as coating deposition, may be performed in a vacuum. Because of the very different nature of processes carried out in each of these steps, it would not be readily feasible to combine steps (i)-(v) in any type of automated, continuous fabrication system or apparatus.

Considerable effort has been expended to improve upon conventional methods as listed in steps (i)-(v) above in order to achieve better dimensional resolution, lower cost, and eliminate the use of chemicals such as etchants. One improvement of particular benefit has been the refinement of plasma etching techniques that eliminate the need for liquid etchants. With reference to step (v) listed above, the use of plasma etching is an enabler for performing microlithographic fabrication in a dry environment.

As is well known to those skilled in the microlithographic art, conventional photoresist materials follow "reciprocity law," responding to the total exposure received, the integral of illumination over time. Conventional photoresists are typically exposed with light in the UV portion of the spectrum, where photon energy is particularly high. Examples of photoresists used microfabrication of semiconductor components are given in U.S. Pat. No. 6,787,283 (Aoai et al.).

Additional advantages to the conventional process described above are provided by e-beam and X-Ray lithography in that they provide a partial reduction of chemical processing, and while X-Ray lithography still requires the use of masks, e-beams can be used to write patterns in a resist directly without a mask. High energy radiation sufficient to cause bond breaking in organic materials causes chain scission, or depolymerization, in a coated resist such that it can be removed in the image area with solvents that will not remove the non-radiated areas. This type of lithographic process depends on imagewise differential salvation of the resist in the development step, and therefore retains the disadvantageous use of liquid chemicals, in addition to requiring expensive masks. E-beams, when used as a direct pattern writing device, suffer from low throughput due to long scan times as a result of the serial limitation of a single beam exposure, and are thus limited to low volume manufacture. E-beams are used primarily in the microfabrication industry to manufacture masks for conventional processes due to their sub-micron high resolution capability.

A further improvement is provided by direct phtotoablation of a resist with a high energy laser at wavelengths less than 400 nm with energies sufficient to cause resist bond breaking, volatilization, and material evacuation of the resist in the irradiated areas, thus making the solvent development step unnecessary. However, the laser systems for direct UV ablation are quite expensive, pulse, difficult to maintain, and suffer from low throughput due to their single beam limitations. Large area eximer lasers solve that deficiency, but they suffer from the requirement of a mask to form the pattern.

Therefore, a need exists for a method of direct writing, or maskless lithography that allows for the use a less expensive and versatile class of laser directed radiation, specifically the solid state IR diode lasers. IR diode lasers offer the advantages of cost, availability, reliability, and lifetime, and are used widely in the communications industry, in a variety of electronic devices such as CD and DVD writers and players, and in the graphic and reprographic arts including digital color printers, laser thermal platewriters, imagesetters, and proofers. In addition, the individual lasers can be joined in an array of up to almost one hundred or more separately modulated lasers dramatically increasing throughput compared to single beam devices. Alternatively, the light can be conjoined from several laser sources into a single bar laser fitted with a segmented light gate modulator of between 200 to up to 1000 separate addressable channels of individually controlled beams. The beam dimensions are limited only by the wavelength of the light they deliver, and can produce spots as small as 2 microns in the array direction as defined by the spatial light modulator. Examples of commercial laser systems with such capability are the Kodak Newsetter and the Creo Trensetter plate-writer-proofer. Feature resolution of 2 microns is therefore possible with such diode laser array systems, which is more than sufficient for thin film transistor array backplanes and color filter arrays used in LCD and OLED displays. These IR lasers, as well as YAG lasers that operate in the visible spectrum, suffer from photon energies less than sufficient to break organic bonds and effect direct ablation of resists.

Additionally, a need exists for a maskless lithographic method for microstructure construction that limits or eliminates the need for wet chemical processing, in order to reduce cost and to be compatible flexible support substrates and roll to roll continuous manufacture.

SUMMARY OF THE INVENTION

The invention and its objects and advantages will become more apparent in the detailed description of the preferred embodiment presented below. This invention relates to an improved process for manufacture of microstructured devices and especially microelectronic circuitry and thin film transistor and color filter arrays comprising:
1. coating first layer of resist material on a substrate; and
2. the substrate comprises a top layer of material to be patterned.
3. creating a pattern on the substrate material by image wise radiation induced thermal removal of the first resist material.
4. removing the substrate material to be patterned by means of an etch process, and
5. removing resist from the regions not exposed in step 2 revealing a micropattern of the substrate material.

In a further embodiment, the resist and optionally the material to be patterned is provided with a light to heat conversion substance that absorbs strongly at the predominant wavelength of the image wise radiation source, whereby the radiation source is a laser that emits light at wavelengths greater than 525 nm, and preferably in the far infrared at wavelengths between 750 and 1100 nm. Some embodiments of this invention provide for applying the resist layer in a vacuum or from a vapor source, and this in combination with all dry etch processes, enables an entirely dry method for patterning a material on a substance.

Therefore, the deficiencies of the current methods of creating micro structures and microelectronic devices are corrected by the elements of this invention, by providing a method that is maskless, can be completely dry and free from all or most of the chemical processing steps, and includes the use of a less expensive and more versatile class of lasers, the solid state IR diode lasers.

BRIEF DESCRIPTION OF THE DRAWINGS

While the specification concludes with claims particularly pointing out and distinctly claiming the subject matter of the present invention, it is believed that the invention will be better understood from the following description when taken in conjunction with the accompanying drawings, wherein:

DETAILED DESCRIPTION OF THE INVENTION

The present invention will be directed in particular to elements forming part of, or in cooperation more directly with the apparatus in accordance with the present invention. It is to be understood that elements not specifically shown or described may take various forms well known to those skilled in the art.

Figure 2:
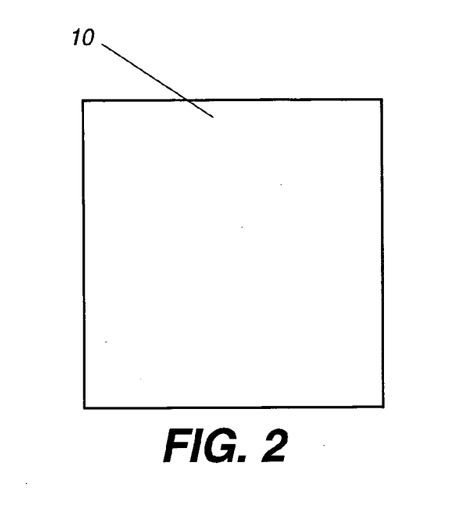
FIG. 2 is a substrate that will be used to carry a patterned layer.
Figure 3:
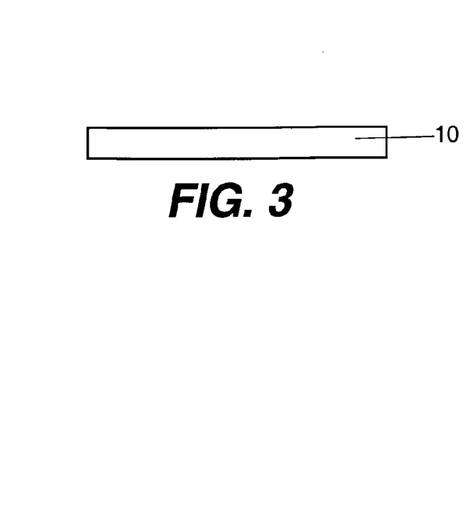
FIG. 3 is a cross-sectional side view, not to scale, of FIG. 2.
Figure 4:
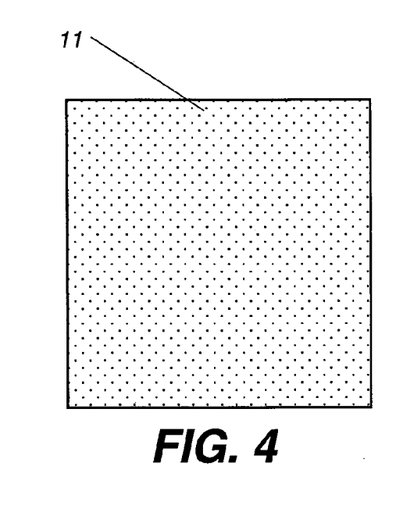
FIG. 4 is block diagram showing a material, which is uniformly deposited that will be patterned on a substrate.
Figure 5:
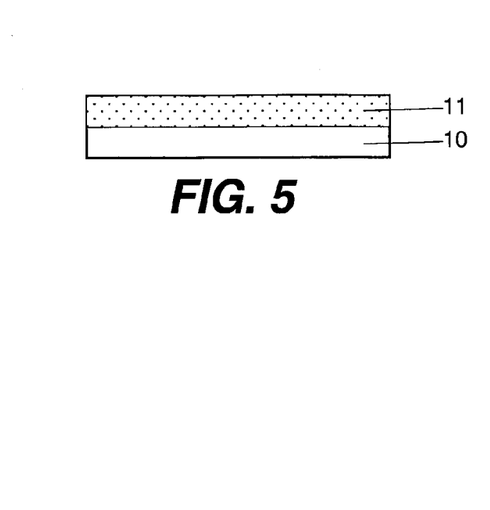
FIG. 5 is a cross-sectional side view, not to scale, of FIG. 4.
Figure 6:
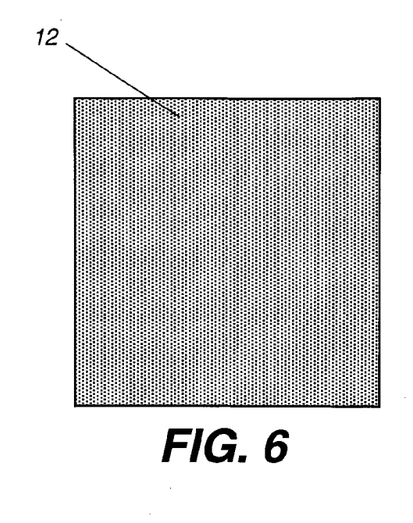
FIG. 6 shows a resist material, which is uniformly deposited.
Figure 7:
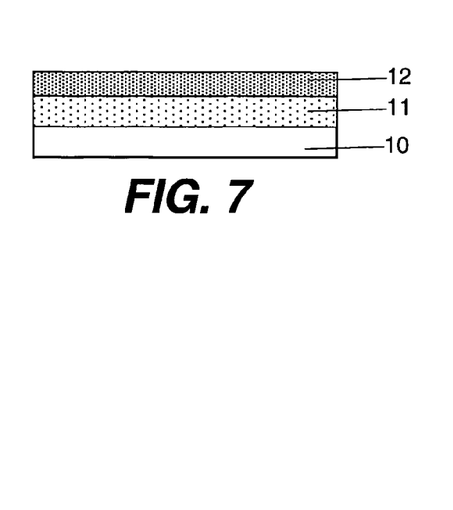
FIG. 7 is a cross-sectional side view, not to scale, of FIG. 6.

A material to be patterned, represented by layer 11 in FIGS. 4 and 5, affixed to substrate 10 (FIGS. 2 and 3), is coated with a resist layer 12 as in FIGS. 6 and 7 by any of several methods practiced in the microfabrication industry, including but not limited to spin coating, spray coating, hopper coating, meyer rod coating, gravure coating, inkjet coating, dip coating, supercritical $CO_2$, vapor deposition and plasma vacuum deposition. The resist layer 12 may also be partially patterned by any of the above mentioned coating methods.

A pattern of intelligence is formed in resist layer 12 by thermally induced ablative removal of the resist material by a source of imagewise heat. Preferably, the imagewise heat is provided by a modulated laser beam or an array of such beams. A schematic representation of such a laser patterning device is shown in FIG. 1.

Figure 1:
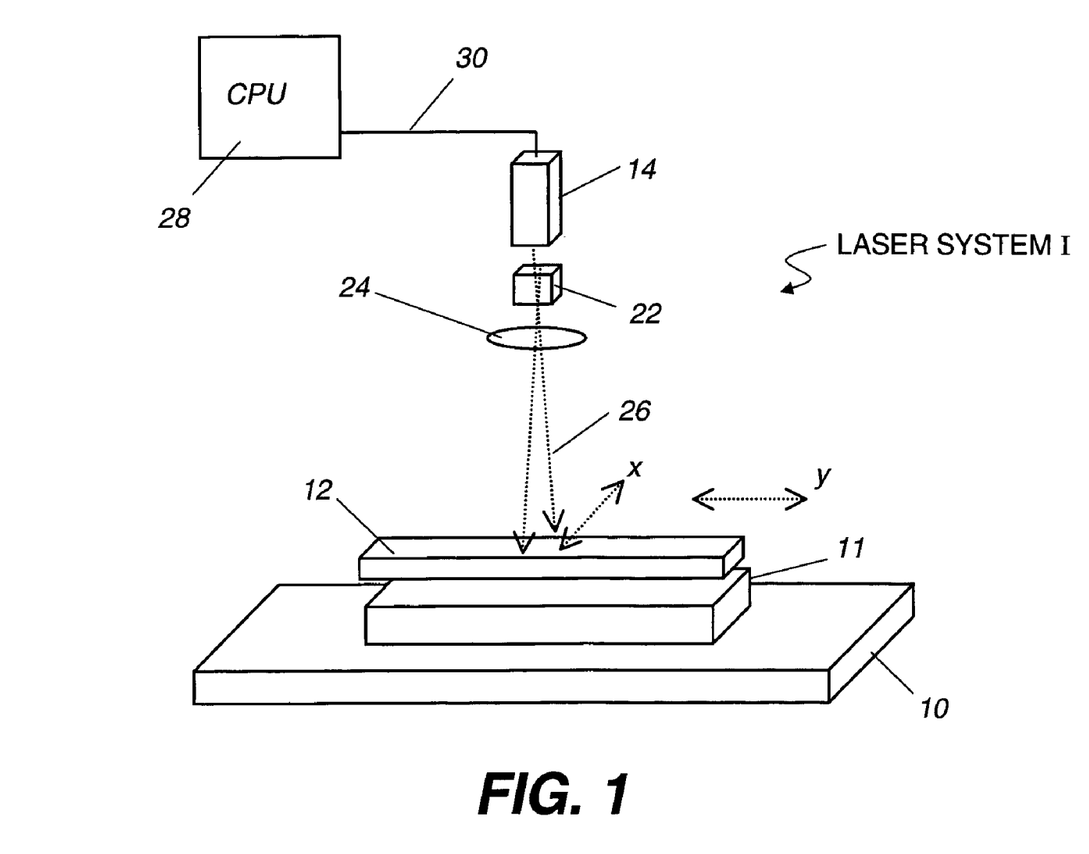
FIG. 1 is a block diagram showing a patterning apparatus for applying a thermoresist pattern according to the present invention.

Referring now to FIG. 1 there is shown a patterning apparatus hereinafter referred to as laser system 1, for ablating resist layer 12 from a substrate layer 11 to be patterned on a support substrate 10 in accordance with the ablative pattern of intelligence formation of the present invention. Laser 14 of the patterning apparatus can be a diode laser or any other high power laser that produces laser beam 26 with a preferred wavelength between 750 and 1100 nm, and preferably between 805 and 840 nm. More than one laser 14 or laser beam 26 can be used simultaneously in this invention. In order to scan laser beam 26 to provide relative movement between laser beam 26 and resist layer 12, a galvanometer 22 that includes a moveable mirror scans the beam through an f-theta lens 24 to form a scan line in direction X. Those skilled in the art will understand that scanning the laser beam can also be accomplished by other kinds of moveable reflective surfaces, such as rotating polygons with mirror faces, or by other devices such as rotating diffraction gratings. Alternately, the needed relative movement could be provided by moving substrate 10 relative to laser beam 26.

In the embodiment shown in FIG. 1, substrate assembly 10, 11, 12 is transported in a direction Y, which is orthogonal to the scan line, by a translation stage allowing the full area to be scanned. In the preferred embodiment, the substrate to be patterned is oriented with the resist side facing the laser source, with either a coversheet provided to collect the ablated debris, or a vacuum collection device affixed to remove said debris. Alternatively, use of transparent substrates 10 and a substrate layer 11 would allow the substrate to be placed with the resist side facing away from the laser source and with the ablated material directed to either a flexible undersheet or a vacuum channel. The supporting substrate can be either rigid or flexible.

The intensity of laser beam 26 at any point in the scan is controlled by the laser power control line 30 using instructions from a control logic processor 28. Alternatively, the intensity of laser beam 26 can be controlled by a separate modulator such as an acousto-optic modulator (not shown), as is well known by those skilled in the art of laser optics. In an alternative embodiment, substrate assembly 10, 11, 12 can remain stationary and the laser writing apparatus made to move or laser beam 26 redirected optically. The important feature is that there is relative movement between laser beam 26 and substrate assembly 10, 11, 12 in order to allow full area scanning. The laser beam power of Laser System I varied from 0 to about 700 milliwatts, with a scan frequency from between 100 to 1 Hz corresponding to dwell times of between about 6 and about 900 microseconds and exposures between about 230 and about 34,000 mJ/cm2. The scan parameters are chosen to optimize the exposure above the resist layer ablation threshold, and below excessive exposure that will create overly wide lines and spots and cause damage to the underlying substances.

In the preferred embodiment, referred hereinafter as Laser System II consisting of a non-coherent infrared diode laser bar at 808 nm (±10 nm) whose beam is divided into 256 separate addressable channels modulated by a spatial light modulator at 5 micron intervals across the beam's width, as described in U.S. Patent Application Publication No. 2005/0266172 (Kay et al.), which is incorporated by reference. The beam intensity distribution in the fast scan direction is a Gaussian whose 1/e2 diameter value is 3.6 micrometers. Peak to peak distance in the fast scan direction was limited by the modulation scheme to 5 microns for the examples of this invention yielding a minimum ablated spot at the film plane of about 5 microns maximum representing 1 pixel in any image rendition. The beam was scanned across the sample by a two axis movable stage that held the sample. Exposure occurred as the fast scan axis movable stage ran at speeds between 1.0 and 0.1 meter per second. The powers available on laser system II were between 11 and 55 milliwatts per channel corresponding to a total exposure range of between 0.22 and 11 J/cm2, although the powers and exposures useful for this invention are not limited to these ranges. The slow scan axis movable stage increments the sample a set distance in preparation for another fast scan motion. This sequence continues until the total desired area is exposed.

The substrate was held against the stage by a vacuum, although those skilled in the art will recognize that many other means exist for affixing the substrate to the stage, for example by clamping, application of pressure, adhesives, with optional heating of the substrate or the like, and including means for accurate placement and registration of the substrate with respect to the ablative pattern. One example of a fixture for this positioning is disclosed in commonly-assigned U.S. Pat. No. 6,695,029 (Phillips et al.) The movable stage can support a substrate oriented either with the resist side face towards the laser source, or away from the laser source when working with transparent substrates 10 and substrate layers 11. When facing the laser source, the ablation debris can be collected either on a coversheet, or preferably, in a vacuum collection device affixed to the laser head. The pattern information was provided by means of a CPU and a RIP capable of processing test patterns or Tif images wherein 1 pixel was assigned a pattern dimension of 5×5 microns.

Any infrared or visible YAG laser system could be used in conjunction with the resist layer 12 of this invention, which is not limited to the Laser Systems I and II descried above. The array of lasers could be an assembly of discreet diodes as in the Kodak Approval Digital Proofing System, or bar laser with a segmented light modulator as in the Kodak Newsetter or the Creo Trendsetter Plate Writer-Proofers. The device for transporting the substrate 10 could be a flatbed for rigid substrates and relative motion could be provided by moving either the laser array or the support stage. Drum systems utilizing flexible supports could also be considered, as well as laser arrays mounted in the suitable proximity for a moving web of substrate 10. There is no limitation to the number of addressable channels or lasers comprising the array, other than the practical limits of the devices themselves, and the ability or the CPU to deliver the information at the appropriate rate. More than one head could be employed simultaneously.

Modulation of the laser power on the plane of resist layer 12 to produce the desired ablative pattern could be accomplished by any means known if the art, such as binary exposure in the on or off mode as practiced in laser systems I and II of this invention, or by pulse width modulation. The only requirement is that the power in the on mode be sufficient to cause ablation at the scan speed chosen.

The imagewise radiation supplied to resist layer 12 and substrate layer 11 could also be from any non-laser source such as a Xenon flash through a mask, or any other radiation source with a high enough intensity at the absorptive wavelengths of the light to heat converting substance to cause thermally induced ablation.

Light to Heat Converting Substance

The resist layer 12 or the substrate layer 11 to be patterned, or a combination of layers 12 and 11 of this invention must absorb a portion of the incident radiation by means of a light to heat converting substance in order to generate the heat required to exceed the ablation threshold given the light sources of IR lasers emit at wavelengths that are not capable of breaking bonds. The layers are thereby provided with radiation absorbing materials such dyes, pigments, carbon, or metals. The preferred heat substances absorb radiation in the near infrared between 750 and 1100 nm, and preferably between 800 and 840 nm. In addition, dyes that absorb in the visible spectrum over 525 nm in conjunction with YAG lasers could also be useful in this invention.

The preferred IR absorbing dyes of this invention are specified in commonly-assigned U.S. Pat. No. 4,973,572 (DeBoer) and U.S. Pat. No. 5,578,416 (Tutt), or described in "Infrared Absorbing Dyes" (ed. Masaru Matsuoka, Plenum Press, 1990). Dye types useful for this invention include, but are not limited to, Cyanines, Squaryliums, Croconiums, Pyryliums, Quinones, Phthalocyanines and their metal complexes, Naphthalocyanines and their metal complexes, azo dyes, and intermolecular charge transfer complexes. Those skilled in the art will recognize that the radiation absorbing chromophores or this invention can be presented to the resist layer 12 as either monomolecular dyes or as pigment particles depending on the particular properties of the absorber, which may also include a carbon black, a metal nanoparticle, or a carbon nanotube. Other radiation absorbers useful for this invention in resist layer 12 are metals or inorganic materials such as chromium, nickel, titanium, molybdenum, tungsten, zirconium, alloys such as NiCr, MoCr, WTi, and the like, oxygen deficient oxides of metals such as aluminum or chromium oxides and the like, or a layered stack of materials that absorb radiation by virtue of their antireflection properties. The main criteria is that radiation-absorbing substance absorb laser light at the given wavelength of the imagewise radiation, at a high enough extinction for ablation of material from resist layer 12. The efficiency of this transfer is well known to depend on the laser fluence, spot size, beam overlap and other factors. Generally, the optical density of radiation-absorbing material as presented in the substrate-resist stack 10, 11, 12 should be at least 0.1 (20% of the light is absorbed).

The radiation absorbers of this invention may be present in the resist layer 12 as a monomolecular species dissolved in the organic binder of the resist layer 12, or as a separate layer within the confines of resist layer 12, or as multiple layers with intervening binders layers. In addition, the radiation absorbing substance can be presented as a top layer of the substrate layer 11 to be patterned, such as a vacuum deposited dye or metal, or the substrate layer 11 to be patterned can be a completely radiation absorbing but non-ablating layer. Useful radiation absorbing and top-layer metals for substrate layer 11 include, but are not limited to, Mo, Ni, Ti, Zr, W, Cr, and the like. Such second metal top-layers are common in the microelectronics industry when placed over aluminum for the prevention of hillock defects and as diffusion barriers. The radiation absorbing material when included in the substrate layer 11 to be patterned can also reside in a sub layer. It is a particularly beneficial and preferred embodiment of this invention, for the cleanest and most efficient ablative pattern evacuations of resist layer 12, to place a radiation absorbing material such as one of the aforementioned metals as the uppermost layer of material 11, directly adjacent to resist layer 12, wherein layer 12 also includes a radiation absorbing substance such as a dye.

The radiation absorbing substances of this invention can be applied to the resist layer 12 or the material to be patterned 11, in a variety of methods known in the art, such as but not limited to, spin coating, spray coating, hopper coating, gravure coating, ink jet deposition, supercritical $CO_2$, and the like, from a solution that may or may not include the binder material. Other methods of application include vacuum or vapor deposition.

Binder

For the purpose of this invention, the binder of resist layer 12 comprises at least a polymeric binder, or a monomeric glass, or a mixture thereof, and preferably also may include an additional gas-producing substance. It is further preferred that the polymeric binder be comprised either wholly or partially of a polymer that is thermally labile or prone to depolymerization at temperatures under 400° C. in order to enhance the efficiency and cleanliness of the ablative pattern.

The term "ablative removal" is broadly understood to be a heat-induced mass ejection of resist layer 12 from substrate layer 11, wherein at least a portion of a component of the resist is converted to a gaseous state. The material that is converted to gaseous state may be the resist material itself or may be some other component material of the resist layer 12 that thus serves as a propellant for ablative ejection. Ablative removal also includes fragmentation or particulate ejection, in which at least some portion of the donor material may not actually be converted to gaseous state, but is effectively fragmented and propelled by the conversion to vapor form of some heated component of the donor. It is therefore preferred that the resist layer comprises as much as possible, thermally labile materials as long as the resist withstands the subsequent etching process that forms the final pattern in substrate layer 11.

To this end, a preferred class of polymer binders can be defined as polymers derived from a monomer CH=CXY, where X and Y independently are electronegative or resonance stabilized groups, and are further specified as the X and Y are among the groups: Halogen (when X is not equal to Y), —CN, —(C=O)OR, —(C=O)R, —(C=O)NR2, where R can independently be H, any alkyl, cycloalkyl or cycloalkenyl, aryl, —(OCH2CH2)$_z$CH3, —(OCH(CH3)CH2)$_z$CH3, or any substituted alkyl or alkoxide group wherein at least one hydrogen atom is replaced with a halogen, silicon, or titanium atom. Mixtures of the above described polymers can also be included in resist layer 12.

Especially useful among polymers under this definition are the alkyl cyanoacrylate polymers wherein X is —CN and Y is (C=O)OR and the R group is methyl, ethyl or a copolymer thereof. Polymers of this type are known to be useful as resins that are efficiently ablated as shown in the following: U.S. Pat. No. 5,468,591 (Pearce et al.); U.S. Pat. No. 5,858,607 (Burberry et al.); and U.S. Pat. No. 6,165,671 (Weidner et al.). Cyanoacrylates have also been cited as useful as electron beam resists by Helbert et al.; Radiation Degradation of α-Substituted Acrylate Polymers and Copolymers; Journal of Applied Polymer Science, Vol. 21, 1977, pp. 797-807, and as a photoablative resist for high-energy UV radiation by Hogan et al.; Laser Photoablation of Spin-on-Glass and Poly(Ethyl Cyanoacrylate) Photoresist; Applied Surface Science 36, 1989, pp. 343-349.

It is anticipated that the physical properties of the cyanoacrylate polymers may need to be modified, particularly to provide improved adhesion to substrate layer 11, and etch resistance to the etchant for substrate layer 11. Such improvements have been applied to their uses as electron beam resists, and include modifying the alkyl groups of the cyanacrylate esters, for example to produce a 3-trimethylsilylpropyl 2-cyanoacrylate as taught in U.S. Pat. No. 5,359,101 (Woods et al.) A widely practiced method for modifying polymer properties of this class involve copolymerization with a wide variety of vinyl monomers to improve etch resistance adhesion, and molecular weight stability, as in EP Patent No. 0343603, U.S. Pat. No. 4,686,168 (Fujii et al.), and JP Patent No. 7-056341. Useful compositions include cyanoacyrlate copolymers with acrylates, methacrylates, fluoroacrylates and fluoromethacrylates, vinyl esters, vinyl ethers, vinyl ketones, styrene, a-methylstyrene, butadiene, isoprene, methacrylamides, acrylamides, acrylonitrile, and methacrylonitrile, and mixtures thereof. In addition, comonomers such as vinyl cinnamate comprising radiation or chemically crosslinkable groups might be included in order to improve etch resistance after the initial ablative patterning of resist layer 12.

Cyanoacrylate polymers are known to exhibit molecular weight instability when dissolved in various solvents (Woods et al.; Vapour deposition of poly(alkyl-2-cyanoacrylate) resist coatings: a new electron-beam/deep-ultra-violet photoresist technology; Polymer 1989, Vol. 30, pp. 1091-1098) in that they will equilibrate to a lower molecular weight from a higher molecular weight. In most cases as practiced in this invention, a useful degree of polymerization is almost always maintained, and usually does not degrade to less than 10,000 (Wt average), and typically resides at about 30,000 in solution. This behavior is particularly troublesome for electron beam or X-ray lithography that depends on well defined and consistent solution behavior in order to control the development step. For the purposes of this invention, however, no favored molecular weight is specified as long as a practical ablation threshold energy is provided, and the resist withstands the etching chemistry used for the final pattern of substrate layer 11. Those knowledgeable in the art will recognize that while ablation efficiency is most likely favored by low molecular weights, other physical and chemical properties such as etch resistance might be favored by higher molecular weights, and that a balance much be struck depending on the demands of the substrate layer 11 and processes used.

Resist layers 12 comprising polycyanoacrylates and their copolymers can be applied to the substrate layer 11 by any means of coating or deposition practiced in the art, and a particular useful method consists of vapor deposition as taught by in U.S. Pat. No. 4,675,273 (Woods et al.). Such a vapor deposition process offers the possibility of an entirely dry process when combined with a dry plasma etching step for the final pattern formation in 11. Combination of the vapor deposited cyanoacrylate with a radiation absorbing species such as a dye or a metal could be accomplished by an alternating deposition of separate cyanoacrylate and dye (metal) layers. Those practiced in the art will recognize that a radiation absorbing element adjacent to a thermally labile polymer will impart enough thermal energy to the polymer to effect ablation.

Other thermally labile and otherwise useful polymers comprising the binder of resist layer 12 include nitrocellulose, copolymers of maleic anhydride including methylvinylether maleic anhydride and styrene maleic anhydride, an alpha-substituted aliphatic polycarbonate, polyketones, polyalkenesufones, alpha-methyl styrene, and a silicone, and their mixtures with polymers of the general structure $CH=CXY$ where X and Y are independently electronegative and resonance stabilized groups.

The polymeric binders of resist layer 12, alone or in combination with polymers already cited, may include polymers known to provide resist properties in lithographic processes, such as Shipley G-Line or Microposit™ photoresists from Shipley Company, Marlborough, Mass., and including materials such as polymethacrylates and acrylates, polystyrene and copolymers with butadiene, acrylates and methacrylates, acrylonitrile, polyesters, polyamides, polyimides, polyvinylchlorides and copolymers with vinyl acetate, poly vinyl esters, polyurethanes, polyvinyl acetals and butyrals, epoxides, polyimides, Novolac resins, polyvinyl phenol resins, and the like. Another useful resin that could be employed is this invention include a resin derived from divinylsiloxane bis(benzocyclobutene) (Cyclotene Resins, Dow Chemical).

Polymeric resins formed in vacuum deposition processes might also be considered as useful binders for the resist layer 12, as for example, poly p-xylene derived from pyrolyzed [2.2] paracyclophane, (Trade name is Parylene, Union Carbide), and resins formed by glow discharge plasma polymerization such as poly alkenes and poly fluoroalkanes. Such vacuum deposited resins might be co-deposited with radiation absorbing materials such as dyes and metals, or applied in separate layers in the confines of resist layer 12.

In addition to polymeric materials, useful binder elements for resist layer 12 include monomeric glasses, defined in U.S. Pat. No. 5,891,602 (Neuman) as a non-polymeric organic material with a glassy state having a glass transition temperature of greater than 25 deg C., capable of forming an amorphous glass in said resist layer, and including the materials claimed and specified therein. Additionally useful monomeric and oligomeric glasses are specified in copending, commonly-assigned U.S. patent application Ser. No. 11/240, 964 and include resins as described in previously cited U.S. Pat. No. 6,165,671, such as hydrogenated and partially hydrogenated rosin esters and similar rosin esters. Commercially available materials include the glycerol ester of hydrogenated wood rosin, such as Staybellite Ester 10 (Hercules), the glycerol ester of hydrogenated rosin, such as Foral 85 (Hercules) and the pentaerythritol ester of modified rosin, such as Pentalyn 344 (Hercules). The amorphous organic solids of resist layer 12 may also be oligomeric resins with a molecular weight of less than about 4000 such as the polyester Tone 260.

The monomeric glasses add organic bulk without adding unnecessary covalent bonds and represent chemical species more likely to be volatilized by the ablation than many typical resins.

Resist layer 12 may also be partially comprised of monomeric or oligomeric materials capable of release a gas when subject to the elevated temperature of the ablated regions and will thus assist in the mass ejection of material from said ablated pattern. Such materials include tetrazoles and triazoles and their amino derivatives as for example 3-amino tetrazole, sodium azide, used as an automotive air bag propellant, azo compounds such as azo-bis-isobutyrylnitrile, azidooxetane polymers and oligomers such as "poly-bamo," and the like.

Any of the layers of resist layer 12 may include, in addition to the materials already disclosed, surface active agents necessary as coating aids and used for the modification of surface properties, hardeners, adhesion promoting agents, and the like, necessary for the physical integrity during the process steps. Visible dyes absorbing at wavelengths other than the imagewise radiation may also be added to any of the layers of resist 12 to provide process visualization.

The resist layer 12 can be from 0.10 to 10 microns thick, and preferably is between 0.25 to 2.5 microns.

Figure 8:
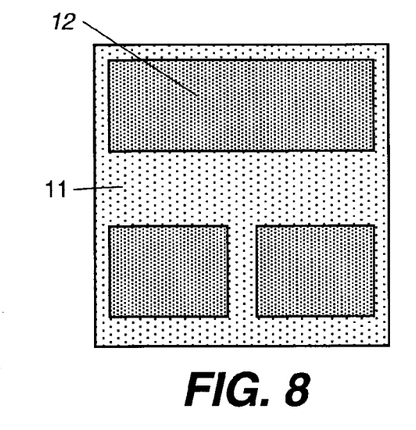
FIG. 8 is a block diagram showing a pattern in the resist, which exposes the non-patterned material below.
Figure 9:
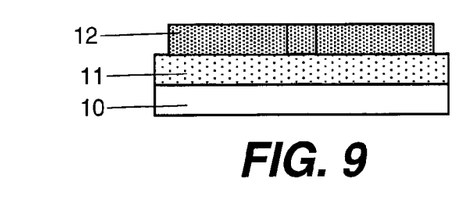
FIG. 9 is a cross-sectional side view, not to scale, of FIG. 8.
Figure 14:
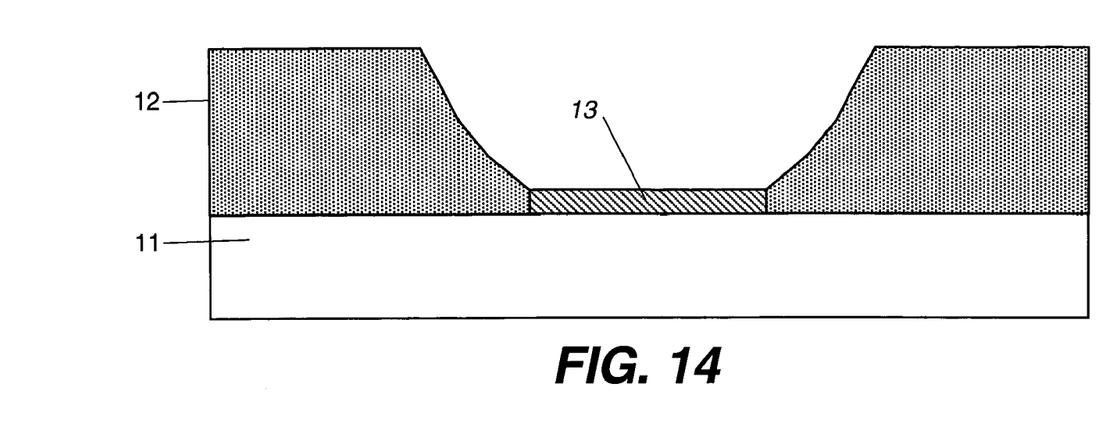
FIG. 14 is a cross-sectional side view, not to scale, of the resist on a substrate or material to be patterned, that shows incomplete cleanout.
Figure 15:
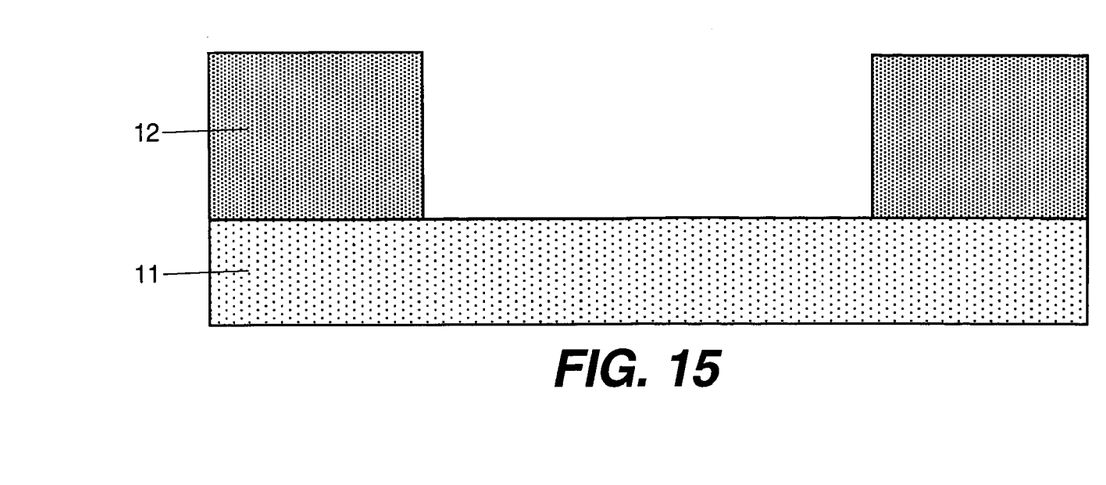
FIG. 15 is a cross-sectional side view, not to scale, of FIG. 14 after a descumming etch.

Immediately following the thermally induced imagewise ablative pattern formation, a small amount of residual organic material may be remaining at the bottom of an ablated region as depicted by item 13 in FIG. 14. This residual layer may be residual resin or other organic thermal decomposition products, and may need to be removed before the final etch process that will be applied to substrate layer 11. This material can be easily removed by any number of de-scumming operations used in conventional lithography including oxygen plasma, either in a vacuum or at atmospheric pressure. Such operations are typically done at short times and low powers so as to not remove significant amounts of resist in non-ablated areas, but sufficient to clean the intended ablated region. FIGS. 8 and 9 show the patterned resist after cleaning with the exposed substrate layer 11 ready to be etched. In addition, the oxygen cleaning step may also provide a steeper wall profile in the resist layer 12. FIG. 15 shows a side view of an ablated line done by a laser after a pre-etch oxygen etch was done. The sides of the ablated layer are normal to substrate 10 and the bottom of the ablated region is cleaned of any residual resist.

Examples of substrate layer 11 that could be patterned are all etchable metals or conductors, semiconductors, dielectrics and polymers. Some metals or conductors commonly used with these resists are Al, Mo, MoCr, Ni, NiCr, Cr, W, WTi, Ti, Zr, Ag, Cu, Au, Pt, Pd, tin, ITO, and polythiophene, etc. Semiconductors commonly used are poly silicon, amorphous silicon, doped silicon, zinc oxide, germanium, gallium arsenide, indium phosphide, mercury cadmium telluride, etc. Some commonly used dielectrics used are $SiN_x$, $SiO_2$, $Al_2O_3$, etc. Some commonly used polymeric dielectrics are Polymethylmethacrylate, polyphenols, polyimides etc.

Other functional microstructures of layer 11 that can be patterned by the process of this invention include circuitry for printed circuit boards, interconnects, and microsprings used in flip-chips made from a MoCr alloy.

Figure 10:
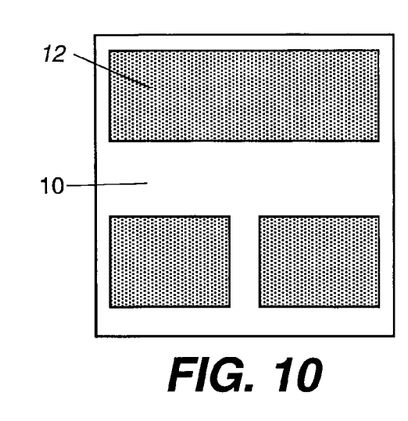
FIG. 10 is a block diagram showing the material etched away exposing the substrate below, while the resist remains unetched.
Figure 11:
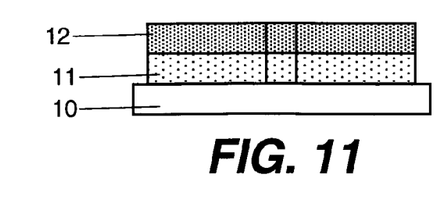
FIG. 11 is a cross-sectional side view, not to scale, of FIG. 10.

The substrate layer 11 to be patterned can be a single material or a plurality of layers. All layers however will be affected in the process. Layers not affected are considered to be in the substrate 10. The areas of the substrate layer 11 not covered by the resist layer 12 are thus exposed to the etching action of the chemical or plasma etchant. It is assumed that the profile of the edges of resist layer 12 are normal to the substrate but they may be sloped if the process requires it. FIG. 9 is the side view of FIG. 8 which depict the device after ablation of resist layer 12 and cleaning of residual organics. FIG. 10 and 11 show the final patterned device with substrate 10 now exposed where substrate layer 11 was exposed in FIG. 8, and with the non-ablated resist layer 12 still on top of substrate layer 11.

Substrate layer 11 can be etched by use of a chemical or plasma etch process. The etch process used can be done in vacuum by plasma with a reactive ion etch, with a plasma torch or with wet etches. Examples of etch gases used for plasma etching include $Cl_2$, $BCl_3$, $SF_6$, $O_2$, $H_2$, $CH_4$, chloroform and $N_2$. Exemplary wet etches include HCl, nitric acid, acidic acid, phosphoric acid, ferric nitrate. The resist layer maybe effected by the etch process but not to the point at which it compromises the quality of the pattern in substrate layer 11. FIG. 11 is the side view of FIG. 10 which show the pattern after etching and before the final resist removal.

Figure 12:
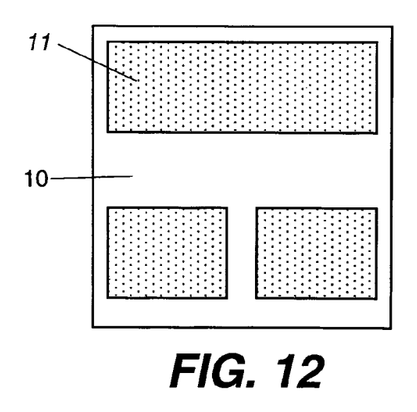
FIG. 12 is a block diagram the patterned material exposed after the removal of the resist.
Figure 13:
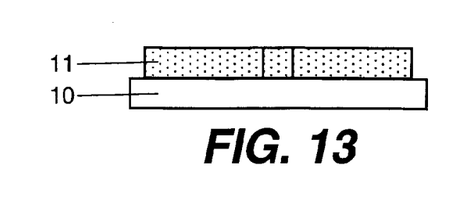
FIG. 13 is a cross-sectional side view, not to scale, of FIG. 12.

The remaining resist on substrate layer 11 in the final pattern can be removed by any method commonly practiced in the conventional lithography processes including but not limited to high power O2 plasma, solvent washing, high pressure water jets, and high temperature baking. FIGS. 12 and 13 show the final pattern of substrate layer 11 now exposed in the areas which were protected in FIG. 8. The resist removal step is optional. Depending on the process and the resist, said resist could be left in place, particularly if a secondary pattern is to be make in substrate layer 11 that is inside the confines of the original pattern of substrate layer 11.

The substrate 10 could be any material used as a carrier for substrate layer 11, including glass, a silicon wafer, a metal such as stainless steel, a printed circuit board, and the like. Flexible supports could be used as well, including polyethylene terephthalate, polyethylene, polypropylene, polyethylene napthalate, polysulphone, polyimides, and the like. Alternatively, the substrate 10 can be any preliminary substructure of a final device, which may include functional layers, registration marks for alignment, as for example the various layers of a thin film transistor array backplane for LCDs or OLED displays.

Example I

On a 1.1 mm glass substrate with between 500 and 1000 Angstroms of sputtered aluminum, a laser ablative resist layer was applied by spin coating a solution of 5 wt % Poly(methyl-co-ethyl)cyanoacrylate, 1.0 wt % IR dye (1), 0.5 wt % Cyan Dye (1), 0.05% Fluorcarbon surfactant FC-431 (3M Corp) in 50/50 Acetonitrile/Cyclopentaone at 1000 RPM resulting in a dry thickness of about 0.33 microns.

Portions of the ablative resist layer were removed in a pattern of intelligence by Laser System I consisting of a single infrared laser beam at 830 nm. The beam size was approximately 16 micrometers by 80 micrometers to the $1/e^2$ point scanning along the wide beam direction. Relative movement between the laser beam and the resist and aluminum coated substrate was provided by a galvanometer that included a moveable mirror that scans the beam through an f-theta lens to form a scan line in wide beam direction. The dwell time was 0.9 milliseconds [Scan frequency was 10 Hz with a power setting of 170] with a suitable power density. Removal of the resist layer was effected in the interstitial regions of a grid pattern wherein the non-ablated areas conformed to the grid lines of aluminum which were to be remaining after etching.

After laser etching of the resist layer, the sample was placed in a Lam model 4600 chlorine based plasma etch tool, product of Lam Research Corporation, Fremont, Calif. The pattern was etched into the metal layer by removal of the aluminum in the laser ablated regions. The sample was then placed in an oxygen plasma Asher and the remaining laser ablative resist material removed. This process transferred the laser resist pattern into the aluminum. Removal of the resist resulted in an aluminum grid pattern with high fidelity with a completely dry patterning process.

Example II

On a 1.1 mm glass substrate with about 1000 Angstroms of sputtered aluminum, a laser ablative resist layer was applied by spin coating a solution of 7.5 wt % Poly(methyl-co-ethyl) cyanoacrylate, 1.0 wt % IR dye (1), 0.5 wt % Cyan Dye (1), 0.05% Fluorcarbon surfactant FC-431 (3M Corp) in 50/50 Acetonitrile/Cyclopentaone at 4000 RPM resulting in a dry thickness of about 0.33 microns.

Portions of the ablative resist layer were removed in a pattern of intelligence by Laser System II consisting of a non-coherent infrared diode laser beam at 808 nm whose beam is divided into 256 separate addressable channels modulated by a spatial light modulator at 5 micron intervals across the beam's width. The beam was scanned across the sample by a movable stage that held the sample at speeds between 1.0 and 0.1 meter per second. For the purpose of this example, 32 of the 256 available channels were activated. Power densities used were between 11 and 38 milliwatts per channel. Removal of the resist layer was effected in the illuminated regions in patterns of 5 micron lines in parallel and perpendicular to the direction of beam scanning.

After patterning, the sample was subjected to an oxygen plasma at 50 watts and 300 millitorr for 40 to 80 seconds in order to remove traces of organic material remaining in the ablated regions. This treatment did not substantially reduce the thickness of the resist in the non-ablated regions, nor mitigate its effectiveness as a resist to the etching step.

A liquid etch was then applied to the sample of example II in order to remove the aluminum in the ablated regions. The etch bath consisted of 25 parts $H_2PO_3$, 1 part $HNO_3$, and 5 parts glacial acetic acid for 3 minutes and 15 seconds followed by two rinse baths of distilled water. The resist in the non-ablated regions was removed in an acetone bath resulting in an aluminum line pattern with high fidelity to the non-ablated regions.

Example III

A glass substrate was coated in ascending order, with 50 nm Chromium, 300 nm Silicon Nitride, 200 nm amorphous silicon, and 50 nm n-doped amorphous silicon by the PECVD process. To this substrate, a laser ablative resist layer was applied by spin coating a solution of 10 wt % Poly(methyl-co-ethyl)cyanoacrylate, 1.0 wt % IR dye (1), 0.5 wt % Cyan Dye (1), 0.05% Fluorcarbon surfactant FC-431 (3M Corp) in 50/50 Acetonitrile/Cyclopentanone at 1000 RPM resulting in a dry thickness of about 1.0 microns.

Portions of the ablative resist layer were removed in a pattern of intelligence by Laser System II consisting of a grid of 10 micron ablated lines in the both the vertical and horizontal directions separated by 100 microns. After oxygen plasma treatment as described in Example II to remove any residual resist in the ablated regions, the substrate was treated with an SF6 plasma for 2.5 min to remove the silicon and silicon nitride layers from the ablated regions. The remaining resist was then removed by an O2 plasma at 300 mTorr and 400 watts for 5 minutes. The resulting pattern was a grid array of isolated silicon nitride/a-silicon/n+ silicon blocks, 100 microns on each side separated by 6-10 micron gaps with very sharp and well defined edges.

The invention has been described in detail with particular reference to certain preferred embodiments thereof, but it will be understood that variations and modifications can be effected within the scope of the invention.

PARTS LIST 10 substrate
12 resist layer
11 substrate layer
13 residue
14 laser
22 galvanometer
24 lens
26 laser beam
28 control logic processor
30 control line

The invention claimed is:

1. A method of making micro-structure devices comprising:
coating first layer of resist material on a substrate;
creating a pattern on said substrate material by image wise radiation induced thermal removal of said first resist material to expose said substrate;
plasma etching said substrate which has been exposed, and the additional step of removing residual organic resist and resist decomposition by-products with $O_2$ plasma.

2. A method as in claim 1 wherein said micro-structure device is a microelectronic device.

3. A method as in claim 1 wherein said radiation has a wavelength of greater than 525 nm.

4. A method as in claim 1 comprising:
wherein said first layer of resist material comprises a plurality of layers.

5. A method as in claim 1 wherein said first layer comprises an organic solid and a light to heat conversion substance.

6. A method as in claim 5 wherein the substrate comprises a light to heat converting substance.

7. A method as in claim 5 wherein said organic solid is selected from a group comprising polymeric binder, monomeric glass, or mixtures thereof.

8. A method as in claim 5 wherein said first layer includes a gas producing substance.

9. A method of claim 6 wherein the light to heat conversion substance is a dye, pigment, carbon or a metal.

10. A method of claim 7 wherein the polymeric binder comprises one or a plurality of binders derived from a monomer or a mixture of monomers of the general formula CH=CXY where X and Y are electronegative or resonance stabilized groups.

11. A method as in claim 10 wherein X equals Y.

12. A method of claim 10 wherein the X and Y groups of the monomer CH=CXY are independently among the groups: Halogen when X does not equal Y, —CN, —(C=O)OR, —(C=O)R, —(C=O)NR2, where R can independently be H, any alkyl, cycloalkyl or cycloalkenyl, aryl, —(OCH2CH2)$_z$CH3, —(OCH(CH3)CH2)$_z$CH3, or any substituted alkyl or alkoxide group wherein at least one hydrogen atom is replaced with a halogen, silicon, or titanium atom.

13. A method of claim 12 wherein X is —CN and Y is (C=O)OR and the R group is methyl, ethyl or a copolymer thereof.

14. A method of claim 10 wherein the monomer represented by the formula CH=CXY is copolymerized with any vinyl monomer.

15. A method as in claim 14 wherein said vinyl monomer is selected from a group comprising acrylates, methacrylates, fluoroacrylates and fluoromethacrylates, vinyl esters, vinyl ethers, vinyl ketones, vinyl cinnamates, styrene, a-methylstyrene, butadiene, isoprene, methacrylamides, acrylamides, acrylonitrile, and methacrylonitrile.

16. A method of claim 7 wherein the polymeric binder is a nitrocellulose.

17. A method of claim 7 wherein the polymeric binder is a copolymer containing maleic anhydride.

18. A method of claim 7 wherein the polymeric binder is an alpha-substituted aliphatic polycarbonate.

19. A method of claim 7 wherein the polymeric binder is a polyalkenesufone.

20. A method of claim 7 wherein the polymeric binder is a polyketone.

21. A method of claim 7 wherein the polymeric binder is a Silicone.

22. A method of claim 7 wherein the polymeric binder is represented by the formula CH=CR—C6H6 where R is any alkyl, cycloalkyl or substituted alkyl group.

23. A method of claim 7 wherein the polymeric binder is a mixture of any two or more binders selected from a group comprising polymers and derived from the general formula CH2=CXY where X and Y are electronegative or resonance stabilized groups and their copolymers, nitrocellulose, copolymers of maleic anhydride, an alpha-substituted aliphatic polycarbonate, polyketones, polyalkenesufones, alpha-methyl styrene, and a silicone.

24. A method of claim 7 wherein the polymeric binder is a vacuum deposited poly p-xylene derived from pyrolyzed paracyclophane.

25. A method of claim 7 wherein the polymeric binder is a resin derived from divinylsiloxane bis(benzocyclobutene).

26. A method as in claim 7 wherein the polymeric binder is a polyethylene, or a poly fluoroalkane produced by glow-discharge plasma polymerization.

27. A method of claim 7 wherein the monomeric glass comprises a non-polymeric organic material with a glassy state having a glass transition temperature of greater than 25 deg C., capable of forming an amorphous glass in said resist layer.

28. A method of claim 8 wherein said gas producing substance is an amino tetrazole or an amino-triazole.

29. A method as in claim 5 comprising:
wherein said resist layer comprises multiple layers with separate binder and light to heat conversion layers.

30. A method as in claim 1 wherein resist layer is 0.10 to 10 microns, and preferably from 0.25 to 2.5 microns.

31. A method as in claim 1 wherein said substrate comprises a plurality of layers.

32. A method as in claim 1 wherein said substrate comprises at least two layers and a least one of the sublayers is a metal that is less than 95% reflective at any wavelength greater and 525 nm and less than 1100 nm.

33. A method as in claim 1 wherein said imagewise pattern is created with a laser having a wavelength which matches an absorptive wavelength of a light to heat converting substance in said resist.

34. A method as in claim 33 wherein said lasers emit in near —IR wavelengths.

35. A method as in claim 1 wherein said pattern is created with a laser through a mask.

36. A method as in claim 1 comprising the additional step of:
    hardening said resist by crosslinking, photocrosslinking, or chemical crosslinking after said thermal removal.

37. A method as in claim 1 comprising the additional step of
    removing said resist by oxygen plasma, solvent wash, or high pressure water after said pattern has been created in said substrate.

38. A method as claimed in claim 1, wherein said image wise radiation induced thermal removal of said first resist material is a maskless lithographic method.

39. A method as claimed in claim 1, wherein said substrate is a flexible support substrate.

40. A method as claimed in claim 39, comprising roll to roll continuous manufacture of said flexible support substrate.

41. A method as claimed in claim 1, wherein said resist layer is applied in a vacuum or from a vapor source.

42. A method as claimed in claim 41, comprising the additional step of removing residual organic resist and resist decomposition by-products with $O_2$ plasma.

43. A method as claimed in claim 1, wherein one or both of the resist material and the substrate comprise a light to heat conversion substance that absorbs at the predominant wavelength of a radiation source used to thermally remove said resist material.

44. A method as claimed in claim 43, wherein the imagewise radiation source is a laser that emits light at wavelengths greater than 525 nm.

45. A method as claimed in claim 44, wherein the laser emits light at wavelengths between 750 and 1100 nm.

* * * * *

UNITED STATES PATENT AND TRADEMARK OFFICE
CERTIFICATE OF CORRECTION

PATENT NO. : 7,867,688 B2
APPLICATION NO. : 11/420817
DATED : January 11, 2011
INVENTOR(S) : Scott E. Phillips et al.

It is certified that error appears in the above-identified patent and that said Letters Patent is hereby corrected as shown below:

In Column 14, line 17 (Claim 19), delete "polyalkenesufone" and insert -- polyalkenesulfone --.

In Column 14, line 31 (Claim 23), delete "polyalkenesufones" and insert -- polyalkenesulfones --.

In Column 14, line 34 (Claim 24), after "from pyrolyzed" insert -- [2.2] --.

Signed and Sealed this
Ninth Day of April, 2013

Teresa Stanek Rea
*Acting Director of the United States Patent and Trademark Office*